United States Patent [19]

Shikata

[11] Patent Number: 5,025,174
[45] Date of Patent: Jun. 18, 1991

[54] FLIP-FLOP CIRCUIT

[75] Inventor: Makoto Shikata, Tokyo, Japan

[73] Assignee: Oki Electric Industry Co., Ltd., Tokyo, Japan

[21] Appl. No.: 313,077

[22] Filed: Feb. 21, 1989

[30] Foreign Application Priority Data

Feb. 29, 1988 [JP] Japan .................................. 63-47047

[51] Int. Cl.[5] ........................ H03K 3/289; H03K 3/26; H03K 3/29
[52] U.S. Cl. ................................ 307/272.2; 307/279; 307/291; 307/289
[58] Field of Search .................... 307/272.2, 279, 291, 307/272.1, 289

[56] References Cited

U.S. PATENT DOCUMENTS 4,777,623 10/1988 Shimazu et al. ..................... 307/571

OTHER PUBLICATIONS

IEEE Journal of Solid-State Circuits, vol. SC-22; No. 3; Jun. 1987; pp. 385-389 "5-Gbit/s Si Integrated Regenerative Demultiplexer and Decisions Circuit;" Clawin et al.

Primary Examiner—Stanley D. Miller
Assistant Examiner—Trong Phan
Attorney, Agent, or Firm—Edward D. Manzo

[57] ABSTRACT

A flip-flop circuit comprises a first transfer gate receiving input data and being conductive responsive to a clock signal, a second transfer gate receiving an inverted input data and being conductive responsive to said clock signal, a third transfer gate receiving said input data and being conductive responsive to an inverted clock signal, and a fourth transfer gate receiving said inverted input data and being conductive responsive to said inverted clock signal. First and second inverters are cross-coupled across output nodes of said first and second transfer gates to serve as a latch circuit. Third and fourth inverters are cross-coupled across output nodes of said third and fourth transfer gates to serve as a latch circuit. A selector selects either the outputs of the first and second transfer gates, or the outputs of the third and fourth transfer gates, as output data and inverted output data of the flip-flop circuit, in accordance with said clock and inverted clock signals.

19 Claims, 4 Drawing Sheets

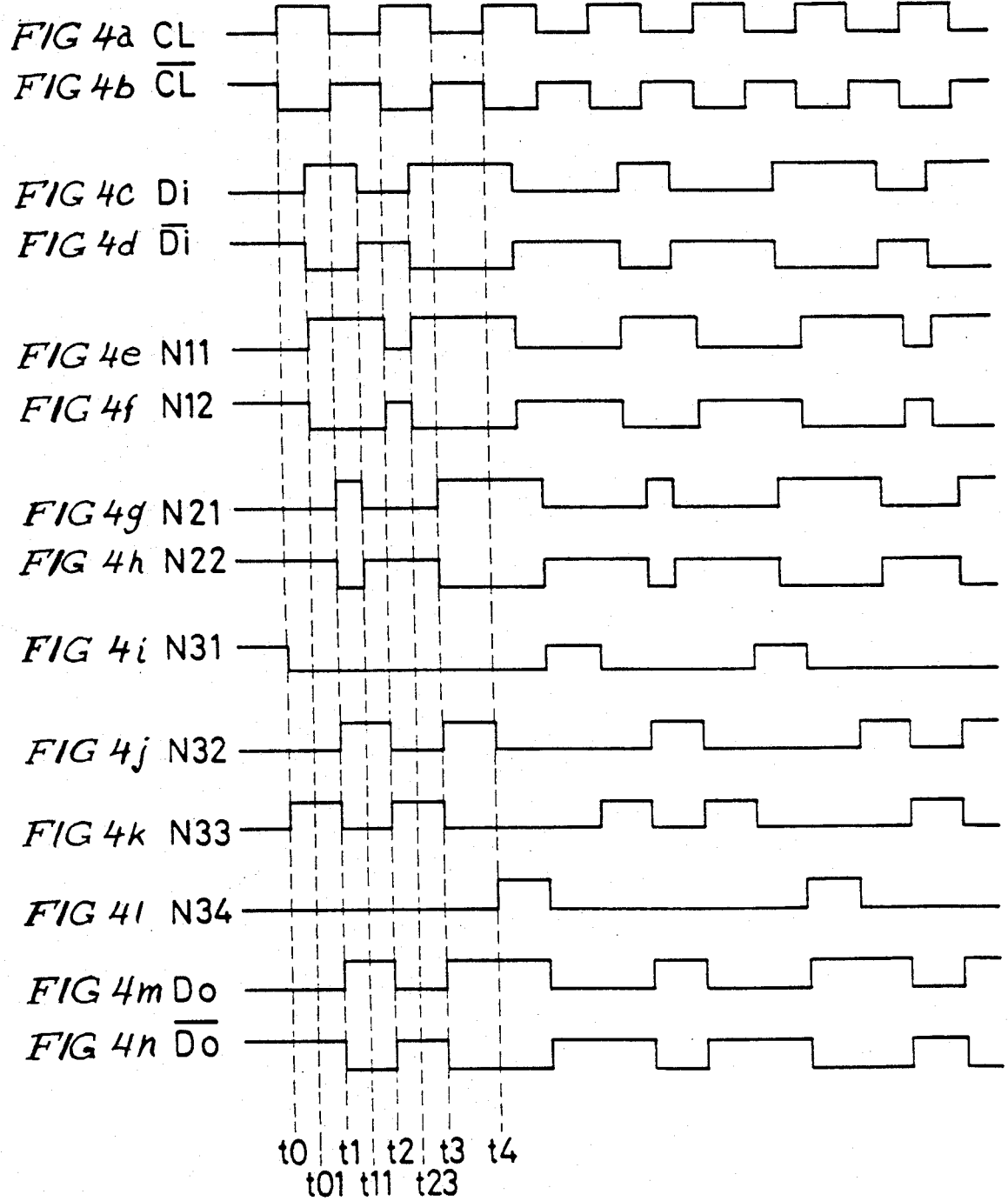

FLIP-FLOP CIRCUIT

BACKGROUND OF THE INVENTION

This invention relates to a high-speed flip-flop circuit possessing functions substantially equivalent to those of a delay flip-flop.

A delay flip-flop (hereinafter referred to as a D-FF) is in general a circuit that takes in data in synchronization with a clock signal and outputs it at a certain time. At high clock frequencies, this type of D-FF is liable to malfunction in taking in the data. Various flip-flop circuits (hereinafter referred to as FF circuits) suitable for high-speed operation have therefore been proposed.

A prior-art FF circuit of this type has been described in the article "5-Gbit/s Si Integrated Regenerative Demultiplexer and Decision Circuit" by Detlef Clawin, Ulrich Langmann, and Hans-Ulrich Schreiber, published on pages 385 to 389 of the (American) *IEEE Journal of Solid-State Circuits*, Vol. SC-22, No. 3, in Jun. 1987. A description thereof will be given with reference to the drawings.

FIG. 1 is a block diagram showing an example of the configuration of a prior-art FF circuit.

This FF circuit comprises a pair of master-slave flip-flops (hereinafter referred to as MS-FFs) 1 and 2 for latching data Di and the inverted data $\overline{\text{Di}}$ in synchronization with a clock signal CL and its inverted clock signal $\overline{\text{CL}}$, and a selector 3 for selecting the outputs of the MS-FFs 1 and 2 responsive to the clock signal CL and the inverted clock signal $\overline{\text{CL}}$ and producing them in the form of data Do and the inverted data $\overline{\text{Do}}$.

The MS-FF 1 is a circuit that latches the data Di and the inverted data $\overline{\text{Di}}$ on the rise of the clock signal CL and outputs them on the fall of the clock signal CL, and has an input terminal D1 for input of the data Di, an inverted input terminal $\overline{\text{D1}}$ for input of the inverted data $\overline{\text{Di}}$, a clock input terminal C1 for input of the clock signal CL, an inverted clock input terminal $\overline{\text{C1}}$ for input of the inverted clock signal, an output terminal Q1, and an inverted output terminal $\overline{\text{Q1}}$. The MS-FF 2 is a circuit that latches the data Di and the inverted data $\overline{\text{Di}}$ on the rise of inverted clock signal $\overline{\text{CL}}$ and outputs them on the fall of the inverted clock signal $\overline{\text{CL}}$, and has an input terminal D2 for input of the data Di, an inverted input terminal $\overline{\text{D2}}$ for input of the inverted data $\overline{\text{Di}}$, a clock input terminal C2 for input of the inverted clock signal $\overline{\text{CL}}$, an inverted clock input terminal $\overline{\text{C2}}$ for input of the clock signal CL, an output terminal Q2, and an inverted output terminal $\overline{\text{Q2}}$. The selector 3 has an input terminal I1 connected to the output terminal Q1, an inverted input terminal $\overline{\text{I1}}$ connected to the inverted output terminal $\overline{\text{Q1}}$, an input terminal I2 connected to the output terminal Q2, an inverted input terminal $\overline{\text{I2}}$ connected to the inverted output terminal $\overline{\text{Q2}}$, a control terminal CS for input of the clock signal CL, an inverted control terminal $\overline{\text{CS}}$ for input of the inverted clock signal $\overline{\text{CL}}$, an output terminal O for output of the data Do, and an inverted output terminal $\overline{\text{O}}$ for output of the inverted data $\overline{\text{Do}}$. When the logic level of the control terminal CS is high (hereinafter denoted "H") and the logic level of the inverted control terminal $\overline{\text{CS}}$ is low (hereinafter denoted "L"), the selector 3 produces the logic level of the input terminal I1 at the output terminal O, and produces the logic level of the inverted input terminal $\overline{\text{I1}}$ at the inverted output terminal $\overline{\text{O}}$; when the control terminal CS is "L" and the inverted control terminal $\overline{\text{CS}}$ is "H," it produces the logic level of the terminal I2 at the output terminal O and the logic level of the inverted input terminal $\overline{\text{I2}}$ at the inverted output terminal $\overline{\text{O}}$.

FIGS. 2a-2j are timing charts for FIG. 1, with times t0 to t4 indicated on the horizontal axis. The operation of FIG. 1 will be explained with reference to this chart.

At time t0, the clock signal CL is "H," the inverted clock signal is "L," the data Di is "L,", and the inverted data $\overline{\text{Di}}$ is "H," so the output terminal Q1 of the MS-FF 1 is held at "L," the inverted output terminal $\overline{\text{Q1}}$ is held at "H," the output terminal Q2 of the MS-FF 2 goes to "L," and the inverted output terminal $\overline{\text{Q2}}$ goes to "H," making the data Do at the output terminal O of the selector 3 "L" and the inverted data $\overline{\text{Do}}$ at the inverted output terminal $\overline{\text{O}}$ H.

At time t1, when the clock signal CL goes to "L" and the inverted clock signal $\overline{\text{CL}}$ goes to "H," since the data Di is "H" and the inverted data $\overline{\text{Di}}$ is "L," the output terminal Q1 of the MS-FF 1 rises to "H" and the inverted output terminal $\overline{\text{Q1}}$ falls to "L." The output terminals Q2 and $\overline{\text{Q2}}$ are not changed.

At time t2, when the clock signal CL goes to "H" and the inverted clock signal $\overline{\text{CL}}$ goes to "L," since the data Di is "L" and the inverted data $\overline{\text{Di}}$ is "H," the output terminal Q2 of the MS-FF 2 is "L" and the inverted output terminal $\overline{\text{Q2}}$ is "H," the output terminal Q1 of the MS-FF 1 remains "H" and the inverted output terminal $\overline{\text{Q1}}$ remains "L." The data Do at the output terminal O of the selector 3 is therefore "H," and the inverted data $\overline{\text{Do}}$ at the inverted output terminal $\overline{\text{O}}$ is "L."

At time t3, when the clock signal CL goes to "L" and the inverted clock signal $\overline{\text{CL}}$ goes to "H," since the data Di is "H" and the inverted data $\overline{\text{Di}}$ is "L," the output terminal Q1 of the MS-FF 1 is "H" and the inverted output terminal $\overline{\text{Q1}}$ is "L," the output terminal Q2 of the MS-FF 2 remains "L" and the inverted output terminal $\overline{\text{Q2}}$ remains "H," the data Do goes to "L," and the inverted data $\overline{\text{Do}}$ goes to "H."

At time t4, when the clock signal CL goes to "H" and the inverted clock signal $\overline{\text{CL}}$ goes to "L," since the data Di is "H" and the inverted data $\overline{\text{Di}}$ is "L," the output terminal Q1 of the MS-FF 1 remains "H" and the inverted output terminal $\overline{\text{Q1}}$ remains "L," the output terminal Q2 of the MS-FF 2 goes to "H" and the inverted output terminal $\overline{\text{Q2}}$ goes to "L," and the data Do goes to "H" while the inverted data $\overline{\text{Do}}$ goes to "L."

The FF circuit in FIG. 1 thus operates as a D-FF by outputting the logic levels of the data Di and the inverted data $\overline{\text{Di}}$ when the clock signal CL and the inverted clock signal $\overline{\text{CL}}$ change as the data Do and inverted data $\overline{\text{Do}}$ at the next change of the clock signal CL and the inverted clock signal $\overline{\text{CL}}$. When the clock signal CL is "H" and the inverted clock signal $\overline{\text{CL}}$ is "L," the output signals of the MS-FF 1 are output by the selector 3, while when the clock signal CL is "L" and the inverted clock signal $\overline{\text{CL}}$ is "H," the output signals of the MS-FF 2 are output by the selector 3, so stable, high-speed operation is possible even at high frequencies of the clock signal CL.

The reason that the FF circuit in FIG. 1 is capable of high-speed operation can be stated as follows. The FF circuit in FIG. 1 is constructed so that the MS-FF 1 and the MS-FF 2 operate at only half the clock frequency at which they would operate if used as stand-alone D-FFs. The FF circuit in FIG. 1 can therefore operate at a bit rate equal to twice the limiting clock frequency of a stand-alone D-FF.

A problem with the FF circuit described above is that, since it employs two MS-FFs 1 and 2 and a selector 3, if these comprise NOR gates, for example, eighteen to twenty-two NOR gates are required; the large number of elements required and the complex circuit structure present an obstacle to high levels of circuit integration, and consume more power than the usual D-FF. A further problem is that the output is delayed by one bit as compared with the usual D-FF, which restricts the applicability of the circuit.

SUMMARY OF THE INVENTION

An object of the invention is to provide a FF circuit that solves the problem of the large number of elements and complex circuit structure, the problem of large power consumption, and the problem of output delay found in the prior art described above.

A flip-flop circuit according to the invention comprises:

a first flip-flop (hereinafter FF) for latching data and inverted data in synchronization with a clock signal and an inverted clock signal and generating a first output signal and a first inverted output signal at a certain timing;

a second FF for latching the above-mentioned data and inverted data in synchronization with the inverted clock signal and clock signal and generating a second output signal and a second inverted output signal at a certain timing; and a selector for selecting and outputting the first output signal and first inverted output signal responsive to the clock signal and selecting and outputting the second output signal and second inverted output signal responsive to the inverted clock signal.

The first and second FFs have the following configuration:

The first FF comprises first and second transfer gates for taking in the afore-mentioned data and inverted data, respectively, responsive to the clock signal, and first and second inverters cross-coupled across the outputs of the first and second transfer gates. The second FF comprises third and fourth transfer gates for taking in the afore-mentioned data and inverted data, respectively, responsive to the inverted clock signal, and third and fourth inverters cross-coupled across the outputs of the third and fourth transfer gates.

The selector may comprise, for example, first and second NOR gates for NORing the output signals of the first and second transfer gates with the clock signal, third and fourth NOR gates for NORing the output signals of the third and fourth transfer gates with the inverted clock signal, a fifth NOR gate for NORing the outputs of the first and third NOR gates, and a sixth NOR gate for NORing the outputs of the second and fourth NOR gates.

In a FF circuit configured according to this invention as described above, the first and second transfer gates and the third and fourth transfer gates switch alternately on and off in synchronization with the clock signal and the inverted clock signal and alternately take in the data and the inverted data. The first and second inverters and the third and fourth inverters temporarily store, then output, the data and inverted data taken in by the transfer gates. The selector alternately outputs the first and second FF outputs in synchronization with the clock signal and inverted clock signal. The circuit thus operates, for example, at high speed in the manner of a D-FF. Since the first and second FFs have few elements, the circuit configuration is simplified and can yield improved scales of integration while consuming less power. There is furthermore no one-bit output delay in the configuration of the first and second FFs. The above-mentioned problems can therefore be eliminated.

The selector circuit can also be simplified by employment of a configuration comprising, for example, six NOR gates.

BRIEF DESCRIPTION OF THE DRAWINGS

FIGS. 4a-4n are timing charts for FIG. 3.

DETAILED DESCRIPTION OF THE EMBODIMENTS

Figure 1:
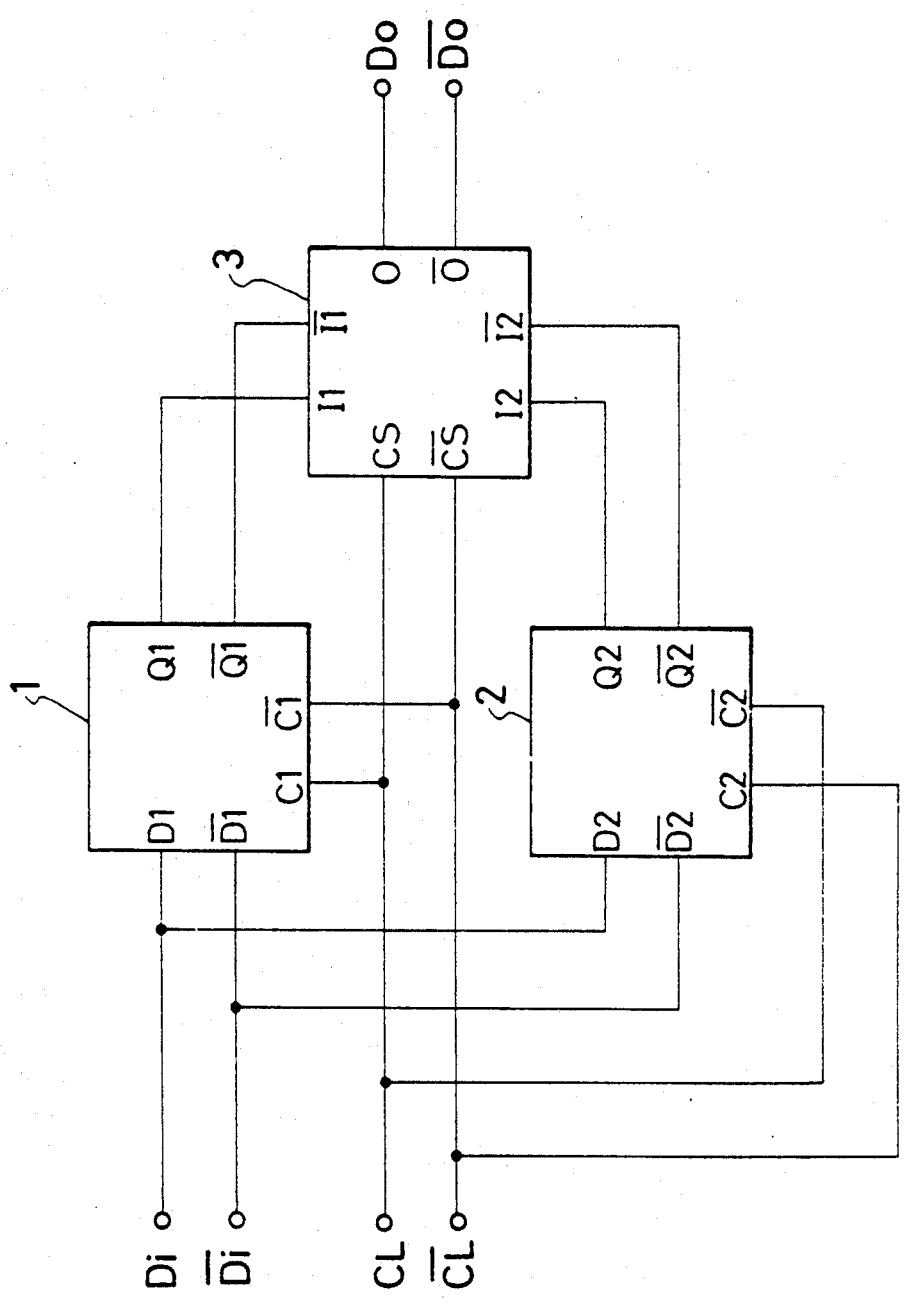
FIG. 1 is a block diagram of a prior-art FF circuit.
Figure 2:
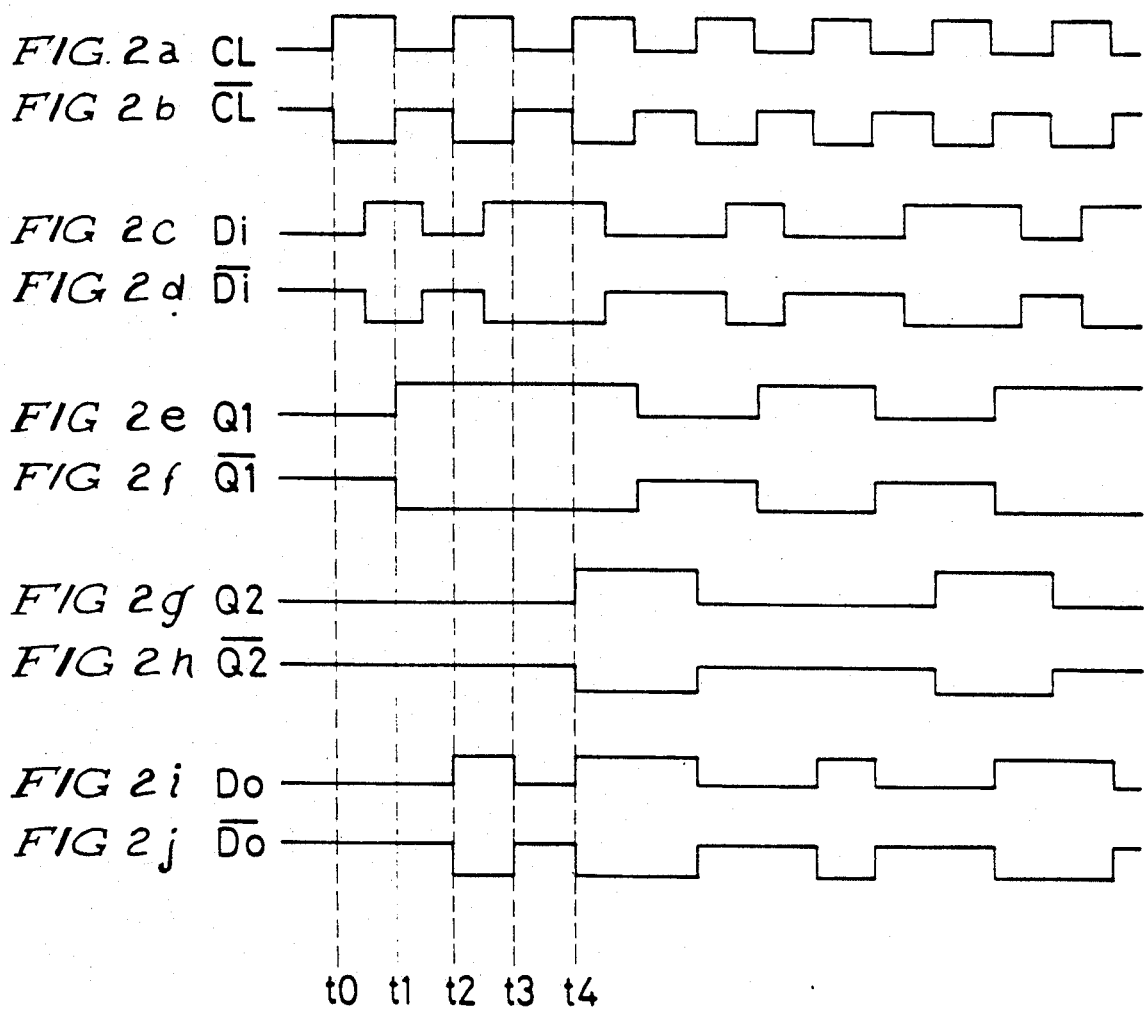
FIGS. 2a-2j are timing charts for FIG. 1.
Figure 3:
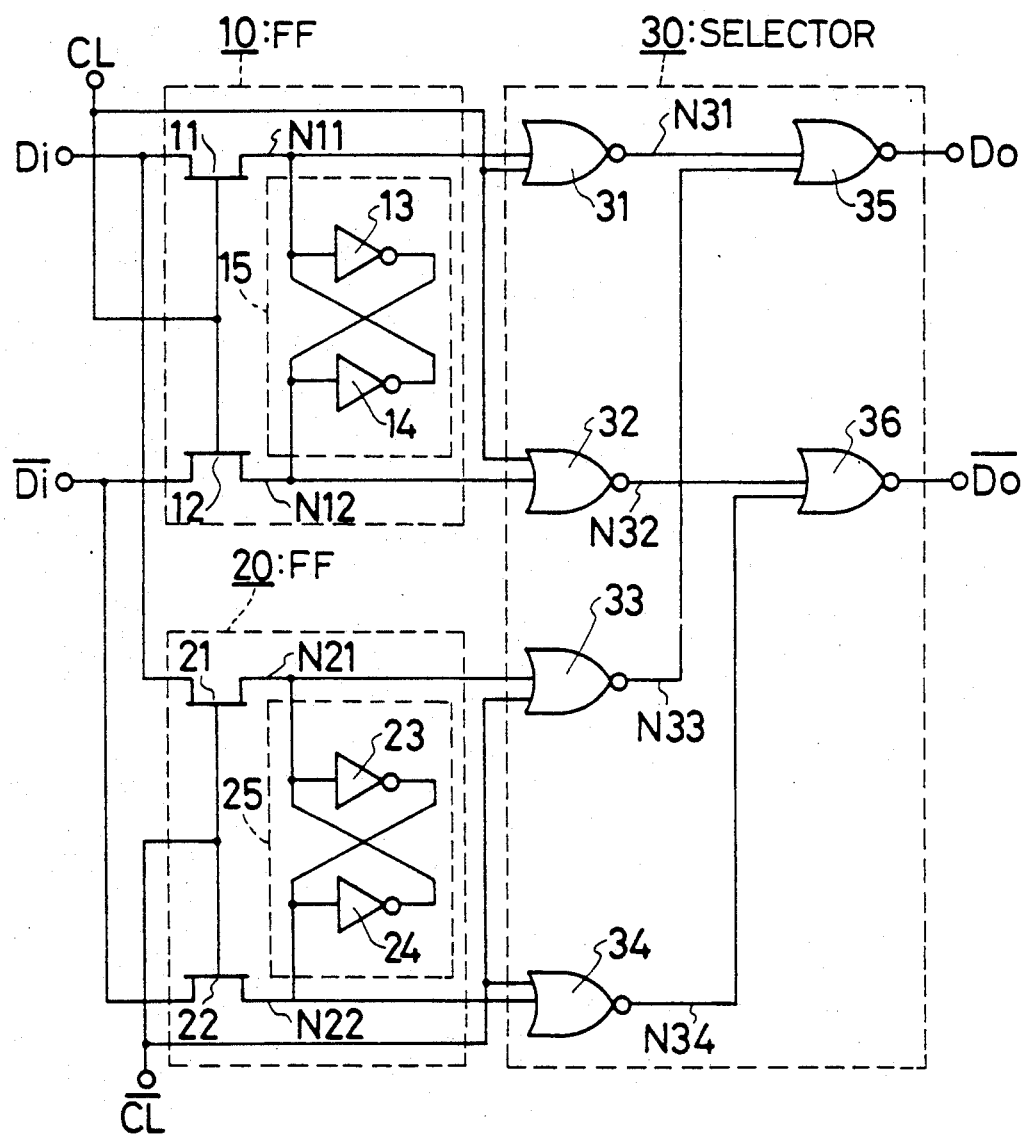
FIG. 3 is a schematic diagram of an FF circuit illustrating an embodiment of this invention.

FIG. 3 is a schematic diagram of an FF circuit illustrating an embodiment of the present invention.

This FF circuit comprises first and second FFs 10 and 20 for latching input data Di and inverted input data $\overline{Di}$ alternately in synchronization with a clock signal CL and an inverted clock signal $\overline{CL}$, and a selector 30 for selecting alternately, responsive to the clock signal CL and the inverted clock signal $\overline{CL}$, the data Di and the inverted data $\overline{Di}$ latched by the first and second FFs 10 and 20 and producing them as data Do and inverted data $\overline{Do}$; the overall function of this FF circuit is to operate as a D-FF.

The first FF 10 comprises a first transfer gate 11 which is in the form of a field effect transistor, which has one of its source/drain electrodes connected to an input data terminal, which is also denoted by Di, to receive the data Di, whose gate electrode is connected to a clock signal input terminal CL so that it turns on and off responsive to the clock signal CL and which, when it is on, takes in the data Di.

The first FF 10 also comprises a second transfer gate 12 which is in the form of a field effect transistor, which has one of its source/drain electrodes connected to an inverted input data terminal $\overline{Di}$ to receive the inverted data $\overline{Di}$, which turns on and off responsive to the clock signal CL and which, when it is on, takes in the inverted data $\overline{Di}$. The other of the source/drain electrodes of the transfer gate 11 is connected to an output node N11 of the flip-flop circuit 10. The other of the source/drain electrodes of the transfer gate 21 is connected to an output node N12 of the flip-flop circuit 10.

The first FF 10 further comprises a latch circuit 15 comprising first and second inverters 13 and 14 which are cross-coupled across the output nodes N11 and N12 of the first and second transfer gates 11 and 12, as illustrated in FIG. 3. More specifically, the first inverter 13 has input and output nodes connected to the outputs of the first and second transfer gates 11 and 12, respectively. The second inverter 14 has input and output nodes connected to the outputs of the second and first transfer gates 12 and 11, respectively.

The second FF 20 comprises a third transfer gate 21 which is in the form of a field effect transistor, which has one of its source/drain electrodes connected to the input data terminal Di to receive the data Di, whose gate electrode is connected to an inverted clock signal input terminal $\overline{CL}$ so that it turns on and off responsive to the inverted clock signal $\overline{CL}$ and which, when it is on, takes in the data Di.

The second FF 20 also comprises a fourth transfer gate 22 which is in the form of a field effect transistor, which has one of its source/drain electrodes connected to the inverted input data terminal $\overline{Di}$ to receive the data $\overline{Di}$, whose gate electrode is connected to the inverted clock signal input terminal $\overline{CL}$ so that it turns on and off responsive to the inverted clock signal $\overline{CL}$ and which, when it is on, takes in the data $\overline{Di}$.

The second FF 20 further comprises a latch circuit 25 comprising third and fourth inverters 23 and 24 which are cross-coupled across the output nodes N21 and N22 of the third and fourth transfer gates 21 and 22. More specifically, the third inverter 23 has input and output nodes connected to the outputs of the third and fourth transfer gates 21 and 22, respectively. The fourth inverter 24 has input and output nodes connected to the outputs of the fourth and third transfer gates 22 and 21, respectively.

The first to fourth transfer gates 11, 12, 21, and 22, which comprise field-effect transistors (hereinafter referred to as FETs), turn on when the clock signal CL and inverted clock signal $\overline{CL}$ applied to their gate electrodes are "H," and turn off when they are "L."

The selector 30 comprises first to sixth two-input NOR gates 31, 32, 33, 34, 35, and 36; the clock signal CL and the node N11 are connected to the inputs of the first NOR gate 31, the clock signal CL and the node N12 to the inputs of the second NOR gate 32, the inverted clock signal $\overline{CL}$ and the node N21 connected to the inputs of the third NOR gate 33, and the inverted clock signal $\overline{CL}$ and the node N22 connected to the inputs of the fourth NOR gate 34. The output nodes N31 and N33 of the first and third NOR gates 31 and 33 are connected to the inputs of the fifth NOR gate 35, the output nodes N32 and N34 of the second and fourth NOR gates 32 and 34 are connected to the inputs of the sixth NOR gate 36, and the data Do and inverted data $\overline{Do}$ are output from the outputs of the fifth and sixth NOR gates 35 and 36.

FIGS. 4a–4n are timing charts for FIG. 3, with times t0 to t4 indicated on the horizontal axis. The operation of FIG. 3 will be explained with reference to this chart.

At time t0, the data Di is "L," the inverted data $\overline{Di}$ is "H," the clock signal CL rises to "H," and the inverted clock signal $\overline{CL}$ falls to "L," so the first and second transfer gates 11 and 12 turn on, the output node N11 goes to "L," the output node N12 goes to "H," the third and fourth transfer gates 21 and 22 turn off, and the output nodes N21 and N22 retain their previous "L" and "H" states, respectively. The "L" of the node N11 and the "H" of the clock signal CL are NORed by the NOR gate 31, the output node N31 of which goes to "L." Similarly, the "H" of the node N12 and the "H" of the clock signal CL pass through the NOR gate 32, the output node N32 of which is kept at "L," the "L" of the node N21 and the "L" of the inverted clock signal $\overline{CL}$ pass through the NOR gate 33, the output node N33 of which goes to "H," and the "H" of the node N22 and the "L" of the inverted clock signal $\overline{CL}$ pass through the NOR gate 34, the output node N34 of which is kept at "L." The "L" of the node 31 and the "H" of the node 33 are NORed by the NOR gate 35 causing the output data Do to be at "L," and the "L" of the node 32 and the "L" of the node 34 are NORed by the NOR gate 36 causing the inverted output data $\overline{Do}$ to be at "H."

At time t01, the data Di rises to "H," and the inverted data $\overline{Di}$ falls to "L." Accordingly, the node N11 rises to "H," and the node N12 falls to "L." Because the clock signal CL is "H," the nodes N31 and N32 are kept at "L."

At time t1, when the clock signal CL goes to "L" and the inverted clock signal $\overline{CL}$ goes to "H," since the data Di is "H" and the inverted data $\overline{Di}$ is "L," the node N11 is kept at "H," the node N12 is kept at "L," the node 21 goes to "H," the node 22 goes to "L," the node 31 is kept at "L," the node 32 goes to "H," the node 33 goes to "L," the node 34 is kept at "L," the data Do goes to "H," and the inverted data $\overline{Do}$ goes to "L."

At time t11, the data Di falls to "L," and the inverted data $\overline{Di}$ rises to "H." Accordingly, the node N21 falls to "L," and the node N22 rises to "H." Because the inverted clock signal $\overline{CL}$ is "H," the nodes N33 and N34 are kept at "L."

At time t2, when the clock signal CL goes to "H" and the inverted clock signal $\overline{CL}$ goes to "L," since the data Di is "L" and the inverted data $\overline{Di}$ "H," the nodes N11, N12, N21, N22, N31, N32, N33 and N34 will be at "L," "H," "L," "H," "L," "L," "H," and "L," respectively, the data Do goes to "L," and the inverted data $\overline{Do}$ goes to "H."

At time t21, the data Di rises to "H," and the inverted data $\overline{Di}$ falls to "L." Accordingly, the node N11 rises to "H," and the node N12 falls to "L." Because the clock signal CL is "H," the nodes N31 and N32 are kept at "L."

At time t3, when the clock signal CL goes to "L" and the inverted clock signal $\overline{CL}$ goes to "H," since the data Di is "H" and the inverted data $\overline{Di}$ is "L," the nodes N11, N12, N21, N22, N31, N32, N33, and N34 will be at "H," "L," "H," "L," "L," "H," "L," and "L," respectively, the data Do goes to "H," and the inverted data $\overline{Do}$ goes to "L."

It is assumed that there is no change in the data Di and the inverted data $\overline{Di}$ between time t3 and time t4.

At time t4, when the clock signal CL goes to "H" and the inverted clock signal $\overline{CL}$ goes to "L," since the data Di is "H" and the inverted data $\overline{Di}$ is "L," the nodes N11, N12, N21, N22, N31, N32, N33, and N34 will be at "H," "L," "H," "L," "L," "L," "L,", and "H," respectively, the data Do goes to "H," and the inverted data $\overline{Do}$ goes to "L."

Thus when the clock signal CL goes to "H" and the inverted clock signal $\overline{CL}$ goes to "L," the selector 30 produces the outputs of the second FF 20, namely the signals at the nodes N21 and N22, as the data Do and the inverted data $\overline{Do}$; when the clock signal CL goes to "L" and the inverted clock signal $\overline{CL}$ goes to "H," it produces the outputs of the first FF 10, namely the signals at the nodes N11 and N12, as the data Do and the inverted data $\overline{Do}$. The FF circuit in FIG. 3 therefore operates as a D-FF by outputting, as the data Do and inverted data $\overline{Do}$, the logic levels of the data Di and the inverted data $\overline{Di}$ when the logic levels of the clock signal CL and the inverted clock signal $\overline{CL}$ change.

This embodiment possesses the following advantages:
(a) Whereas the prior-art FF circuit required eighteen to twenty-two NOR gates, the FF circuit of this embodiment comprises four transfer gates 11, 12, 21, and 22, four inverters 13, 14, 23, and 24, and six NOR gates 31 to 36; thus it has fewer elements, hence consumes less power, and enables higher-scale integration to be achieved due to its simpler circuit structure.
(b) The data Do and inverted data $\overline{Do}$ are output with the same timing as in the usual D-FF, so this embodiment can be widely used in the same applications as the usual D-FF, where high processing speeds are required.

The scope of this invention is not limited to the embodiment shown in the drawings, but permits various modifications, some examples of which are given next.

(i) The transfer gates 11, 12, 21, and 22 may comprise transistors other than FETs, or may comprise devices such as analog switches having a pair of transistors connected in parallel.

(ii) The selector 30 may comprise a combination of NOR gates and gates other than NOR gates, such as NAND gates, or may comprise only gates other than NOR gates.

In place of the combination of the NOR gates, the selector 30 can comprise other logic circuit of the same function. Moreover, it can comprises two pairs of transfer gates controlled by the clock signal CL and the inverted clock signal $\overline{CL}$, and selectively transfer the outputs of the nodes N11 and N12, or the nodes N21 and N22, to the output nodes Do and $\overline{Do}$.

As has been explained in detail, since the first and second FFs according to this invention comprise two transfer gates and two inverters apiece, the number of elements is small, power consumption can be accordingly reduced, and the circuit structure can be simplified, permitting a higher scale of integration. There is furthermore no one-bit output delay as in the prior art; the removal of this restriction enables many applications.

What is claimed is:

1. A flip-flop circuit comprising:
    first and second flip-flops each having respective first and second output nodes;
    said first flip-flop being coupled for latching input data and inverted input data in synchronization with a clock signal and an inverted clock signal and for generating a first output signal and a first inverted output signal at said first output node and said second output node of said first flip-flop;
    said second flip-flop being coupled for latching input data and inverted input data in synchronization with said inverted clock signal and clock signal and generating a second output signal and a second inverted output signal at said first output node and said second output node of said second flip-flop; and
    a selector circuit coupled to said first and second flip-flops for selecting and outputting said first output signal and first inverted output signal responsive to said clock signal and selecting and outputting said second output signal and second inverted output signal responsive to said inverted clock signal;
    wherein said first flip-flop comprises first and second transfer gates coupled for receiving said input data and inverted input data, respectively, responsive to said clock siganl, and first and second inverters cross-coupled across the output node of said first and second transfer gates, said output nodes of said first and second transfer gates comprising said first and second output nodes of said first flip-flop; and
    wherein said second flip-flop comprises third and fourth transfer gates coupled for receiving said data and inverted input data, respectively, responsive to said inverted clock signal, and third and fourth inverters cross-coupled across the output nodes of said third and fourth transfer gates, said output nodes of said first and second transfer gates comprising said first and second output nodes of said second flip-flop.

2. A flip-flop circuit according to claim 1 wherein said selector circuit is coupled to select said first output signal and said first inverted output signal when said clock signal is Low; and
    said selector circuit is coupled to select said second output signal and said inverted output signal when said inverted clock signal is Low.

3. A flip-flop circuit according to claim 1, wherein said selector circuit comprises first and second NOR gates for NORing the output signals of said first and second transfer gates with said clock signal, third and fourth NOR gates for NORing the output signals of said third and fourth transfer gates with said inverted clock signal, a fifth NOR gate for NORing the outputs of said first and third NOR gates, and a sixth NOR gate for NORing the outputs of said second and fourth NOR gates.

4. A flip-flop circuit according to claim 1, wherein said first output signal and first inverted output signal of said first flip-flop are the outputs of said first and second transfer gates; and
    said second output signal and second inverted output signal of said second flip-flop are the outputs of said third and fourth transfer gates.

5. A flip-flop circuit according to claim 1, wherein said first inverter has input and output nodes connected to the outputs of said first and second transfer gates, respectively;
    said second inverter has input and output nodes connected to the outputs of said second and first transfer gates, respectively;
    said third inverter has input and output nodes connected to the outputs of said third and fourth transfer gates, respectively; and
    said fourth inverter has input and output nodes connected to the outputs of said fourth and third transfer gates, respectively.

6. A flip-flop circuit according to claim 1, wherein said first transfer gate comprises a first field-effect transistor having one of its source/drain electrodes connected to receive said data and having the other of its source/drain electrodes constituting said output node of said first transfer gate, and
    said second transfer gate comprises a second field-effect transistor having one of its source/drain electrodes connected to receive said inverted input data and having the other of its source/drain electrodes constituting said output node of said second transfer gate, and
    the gate electrodes of said first and second field-effect transistors are connected to receive said clock signal;
    said third transfer gate comprises a field-effect transistor having one of its source/drain electrodes connected to receive said data and having the other of its source/drain electrodes constituting said output node of said third transfer gate, and
    said fourth transfer gate comprises a fourth field-effect transistor having one of its source/drain electrodes connected to receive said inverted input data and having the other of its source/drain electrodes constituting said output node of said fourth transfer gate;
    the gates of said third and fourth field-effect transistors are connected to receive said inverted clock signal.

7. A flip-flop circuit according to claim 3 wherein said first output signal and first inverted output signal of said first flip-flop are the outputs of said first and second transfer gates; and
said second output signal and second inverted output signal of said second flip-flop are the outputs of said third and fourth transfer gates.

8. A flip-flop circuit comprising:
a first transfer gate receiving input data, and being conductive responsive to a clock signal;
a second transfer gate receiving an inverted input data, and being conductive responsive to said clock signal;
a third transfer gate receiving said input data, and being conductive responsive to an inverted clock signal;
a fourth transfer gate receiving said input data, and being conductive responsive to said inverted clock signal;
first and second inverters cross-coupled across output nodes of said first and second transfer gates;
third and fourth inverters cross-coupled across output nodes of said third and fourth gates;
a selector circuit receiving the outputs of said first, second, third and fourth transfer gates and selectively outputting said outputs of said first and second transfer gates or said outputs of said third and fourth transfer gates in accordance with said clock and inverted clock signals.

9. A flip-flop circuit according to claim 8, wherein said selector circuit selects said outputs of said first and second transfer gates when said clock signal is Low; and
said selector circuit selects said outputs of said third and fourth transfer gates when said inverted clock signal is Low.

10. A flip-flop circuit according to claim 8, wherein said selector circuit comprises:
a first NOR gate NORing said output of said first transfer gate and said clock signal;
a second NOR gate NORing said output of said second transfer gate and said clock signal;
a third NOR gate NORing said output of said third transfer gate and said inverted clock signal;
a fourth NOR gate NORing said output of said fourth transfer gate and said inverted clock signal;
a fifth NOR gate NORing the outputs of said first and third NOR gates, and producing an output constituting output data of said flip-flop circuit; and
a sixth NOR gate NORing the outputs of said second and fourth NOR gates, and producing an output constituting inverted output data of said flip-flop circuit.

11. A flip-flop circuit according to claim 8, wherein said first inverter has input and output nodes connected to the outputs of said first and second transfer gates, respectively;
said second inverter has input and output nodes connected to the outputs of said second and first transfer gates, respectively;
said third inverter has input and output nodes connected to the outputs of said third and fourth transfer gates, respectively; and
said fourth inverter has input and output nodes connected to the outputs of said fourth and third transfer gates, respectively.

12. A flip-flop circuit according to claim 8, wherein said transfer gates are field-effect transistors, the input and output of each of said transfer gates are source/drain electrodes, and said clock signal and inverted clock signals are applied to gate electrodes of the field-effect transistors.

13. A flip-flop circuit according to claim 10 wherein said transfer gates comprise field-effect transistors, the input and output of each of said transfer gates are source/drain electrodes, and said clock signal and inverted clock signals are applied to gate electrodes of the field-effect transistors.

14. A flip-flop circuit comprising:
an input data terminal;
an inverted input data terminal;
an output data terminal;
an inverted output data terminal;
a clock signal input terminal;
an inverted clock signal input terminal;
a first transfer gate having a first main electrode connected to said data input terminal, and a control electrode connected to said clock signal input terminal, and being conductive when said clock signal is High;
a second transfer gate having a first main electrode connected to said inverted data input terminal, and a control electrode connected to said clock signal input terminal, and being conductive when said clock signal is High;
a third transfer gate having a first main electrode connected to said data input terminal, and a control electrode connected to said inverted clock signal input terminal, and being conductive when said inverted clock signal is High;
a fourth transfer gate having a first main electrode connected to said inverted data input terminal, and a control electrode connected to said inverted clock signal input terminal, and being conductive when said inverted clock signal is High;
first and second inverters cross-coupled across second main electrodes of said first and second transfer gates;
third and fourth inverters cross-coupled across second main electrodes of said third and fourth gates;
a first selecting means selectively transferring signals on said second electrode of said first transfer gate or signals on said second main electrode of said third transfer gate to said data output terminal, depending on which of said clock signal and said inverted clock signal is Low; and
a second selecting means selectively transferring signals on said second electrode of said second transfer gate or signals on said second main electrode of said fourth transfer gate to said inverted data output terminal, depending on which of said clock signal and said inverted clock signal is Low.

15. A flip-flop circuit according to claim 14, wherein said first selecting means selects the signals on said second main electrode of said first transfer gate to said data output terminal when said clock signal is Low;
said first selecting means selects the signals on said second main electrode of said third transfer gate to said data output terminal when said inverted clock signal is Low;
said second selecting means selects the signals on said second main electrode of said second transfer gate to said inverted data output terminal when said clock signal is Low; and said second selecting means selects the signals on said second main electrode of said fourth transfer gate to said inverted data output terminal when said inverted clock signal is Low.

16. A flip-flop circuit according to claim 14, wherein said first selecting means comprises:
- a first NOR gate having an input node connected to said second main electrode of said first transfer gate, and having another input node connected to said clock signal input terminal;
- a second NOR gate having an input node connected to said second main electrode of said third transfer gate, and having another input node connected to said inverted clock signal input terminal; and
- a third NOR gate having input nodes connected to the output nodes of said first and second NOR gates and having an output node connected to said output data terminal; and said second selecting means comprises:
- a fourth NOR gate having an input node connected to said second main electrode of said second transfer gate, and having another input node connected to said clock signal input terminal;
- a fifth NOR gate having an input node connected to said second main electrode of said fourth transfer gate, and having another input node connected to said inverted clock signal input terminal; and
- a sixth NOR gate having input nodes connected to the output nodes of said fourth and fifth NOR gates and having an output node connected to said inverted output data terminal.

17. A flip-flop circuit according to claim 14, wherein said first inverter has input and output nodes connected to said second main electrodes of said first and second transfer gates, respectively;
said second inverter has input and output nodes connected to said second main electrodes of said second and first transfer gates, respectively;
said third inverter has input and output nodes connected to said second main electrodes of said third and fourth transfer gates, respectively; and
said fourth inverter has input and output nodes connected to said second main electrodes of said fourth and third transfer gates, respectively.

18. A flip-flop circuit according to claim 14, wherein said transfer gates are field-effect transistors, said first and second main electrodes are source/drain electrodes, and said control electrodes are gate electrodes.

19. A flip-flop circuit according to claim 16 wherein said transfer gates comprise field-effect transistors having source/drain and gate electrodes, wherein said first and second main electrodes comprise said source/drain electrodes, and said control electrodes comprise said gate electrodes.

* * * * *